US010566260B2

(12) United States Patent
Otremba et al.

(10) Patent No.: US 10,566,260 B2
(45) Date of Patent: Feb. 18, 2020

(54) SMD PACKAGE WITH TOP SIDE COOLING

(71) Applicant: Infineon Technologies Austria AG, Villach (AT)

(72) Inventors: Ralf Otremba, Kaufbeuren (DE); Markus Dinkel, Unterhaching (DE); Ulrich Froehler, Nersingen (DE); Josef Hoeglauer, Heimstetten (DE); Uwe Kirchner, St. Michael i. Lav. (AT); Guenther Lohmann, Sattendorf (AT); Klaus Schiess, Allensbach (DE); Xaver Schloegel, Sachsenkam (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/124,336

(22) Filed: Sep. 7, 2018

(65) Prior Publication Data
US 2019/0080980 A1 Mar. 14, 2019

(30) Foreign Application Priority Data
Sep. 8, 2017 (DE) .................. 10 2017 120 747

(51) Int. Cl.
*H01L 23/367* (2006.01)
*H01L 23/495* (2006.01)
(Continued)

(52) U.S. Cl.
CPC ............ *H01L 23/367* (2013.01); *H01L 21/56* (2013.01); *H01L 23/4334* (2013.01);
(Continued)

(58) Field of Classification Search
CPC ............... H01L 23/367; H01L 23/4334; H01L 23/49541; H01L 23/49555
See application file for complete search history.

(56) References Cited

U.S. PATENT DOCUMENTS

| 5,272,375 A | 12/1993 | Belopolsky |
| 5,581,118 A | 12/1996 | Mays |
(Continued)

FOREIGN PATENT DOCUMENTS

| DE | 69525420 T2 | 10/2002 |
| DE | 102009000588 A1 | 10/2009 |
(Continued)

*Primary Examiner* — Peniel M Gumedzoe
(74) *Attorney, Agent, or Firm* — Murphy, Bilak & Homiller, PLLC

(57) ABSTRACT

A package encloses a power semiconductor die and has a package body with a package top side, package footprint side and package sidewalls. The die has first and second load terminals and blocks a blocking voltage between the load terminals. The package further includes: a lead frame structure for electrically and mechanically coupling the package to a support, the lead frame structure including an outside terminal extending out of the package footprint side and/or out of one of the package sidewalls and electrically connected with the first load terminal; a top layer arranged at the package top side and electrically connected with the second load terminal; and a heat spreader arranged external of the package body and in electrical contact with the top layer. A top surface of the heat spreader has an area greater than the area of the bottom surface.

19 Claims, 2 Drawing Sheets

(51) Int. Cl.
*H01L 21/56* (2006.01)
*H01L 23/433* (2006.01)
*H01L 23/31* (2006.01)

(52) U.S. Cl.
CPC .... *H01L 23/49541* (2013.01); *H01L 23/3107* (2013.01); *H01L 23/49555* (2013.01)

(56) References Cited

U.S. PATENT DOCUMENTS

| | | | |
|---|---|---|---|
| 6,081,027 A * | 6/2000 | Akram | H01L 21/563 257/706 |
| 6,181,007 B1 * | 1/2001 | Yamazaki | H01L 23/051 257/718 |
| 2004/0169289 A1 | 9/2004 | Satou et al. | |
| 2004/0232545 A1 | 11/2004 | Takaishi | |
| 2010/0133670 A1 | 6/2010 | Liu et al. | |
| 2010/0148346 A1 * | 6/2010 | Quinones | H01L 23/49524 257/690 |
| 2012/0043662 A1 * | 2/2012 | Ohno | H01L 23/3185 257/773 |
| 2014/0035112 A1 | 2/2014 | Kadoguchi et al. | |
| 2017/0092559 A1 | 3/2017 | Iwasaki et al. | |

FOREIGN PATENT DOCUMENTS

| | | |
|---|---|---|
| DE | 102012112769 A1 | 6/2013 |
| DE | 102015101674 A1 | 8/2016 |
| DE | 102015120396 A1 | 6/2017 |

\* cited by examiner

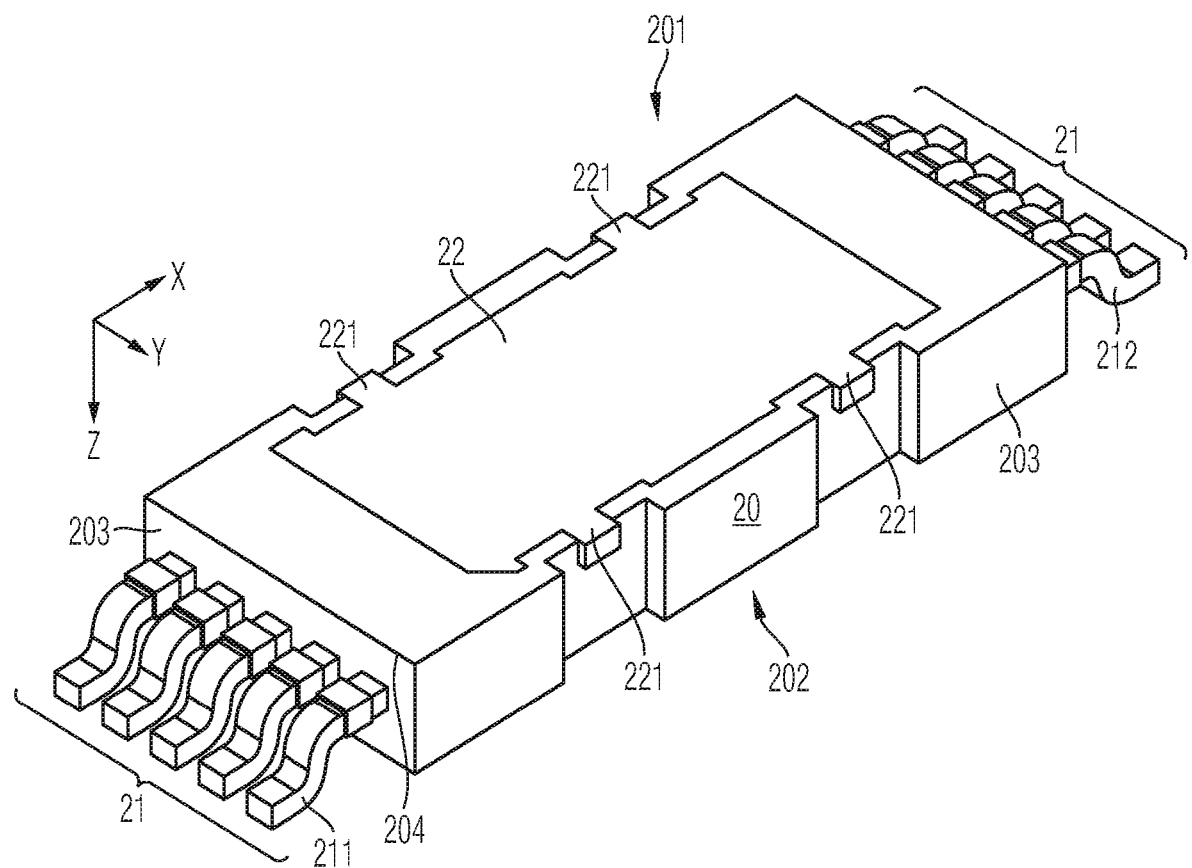

SMD PACKAGE WITH TOP SIDE COOLING

TECHNICAL FIELD

This specification refers to embodiments of a package enclosing a power semiconductor die and to embodiments of a method of processing a package. In particular, this specification refers to embodiments of a Surface-Mount Device (SMD) package with Top Side Cooling and to embodiments of a corresponding method.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled, e.g., by means of an insulated electrode, sometimes referred to as gate electrode. For example, upon receiving a corresponding control signal from, e.g., a driver, the control electrode may set the power semiconductor device in one of a conducting state and a blocking state.

After the power semiconductor die has been manufactured, it is usually installed within in a package, e.g., in a manner that allows the package with the die to be arranged within an application, e.g., in a power converter, e.g., such that the die may be coupled to a support, e.g., a printed circuit board (PCB).

To this end, a technology commonly referred to as surface-mount technology (SMT) is known, wherein this notion may generally refer to producing electronic circuits in which the components are mounted or placed directly onto the surface of a PCB. Such a component is hence referred to as surface-mount-device (SMD) component. For example, this technology has replaced, at least in some application areas, the so-called through-hole technology construction method of fitting components with wire leads into holes in the circuit board.

Generally, an SMD component can be smaller than its through-hole counterpart. It may have short pins or leads of various styles, flat contacts (also known as "terminal pads"), a matrix of solder balls (e.g., a so-called Ball Grid Array (BGA)), and/or terminations on the package body of the component.

Exemplary configurations of an SMD package are known from documents DE 10 2015 101 674 A1 and DE 10 2015 120 396 A1. Each of these SMD packages encloses a power semiconductor die and has a package body with a package top side, a package footprint side and package sidewalls, wherein the package sidewalls extend from the package footprint side to the package top side. The die has a first load terminal and a second load terminal and is configured to block a blocking voltage applied between said load terminals. The packages each further comprise a lead frame structure configured to electrically and mechanically couple the package to a support with the package footprint side facing to the support. The lead frame structure comprises outside terminals extending out of the package sidewall and electrically connected with the first load terminal of the die. Further, each of the packages comprise a top layer arranged at the package top side and being electrically connected with the second load terminal of the die.

Accordingly, each of these SMD packages known from documents DE 10 2015 101 674 A1 and DE 10 2015 120 396 A1 may exhibit a package top side that faces away from the support and that is equipped with a top layer to which a heat dissipation device, e.g., a heat sink, may be mounted. Thereby, heat can be removed away from the package that encloses the die. Such kind of packages may hence be referred to as a SMD-Top Side Cooling (SMD-TSC) packages.

The primary function of the heat dissipation device is to remove heat away from the package body. To this end, it is known to couple a heat sink to the top layer, wherein the heat sink may be electrically insulated from the top layer. Means that are necessary to provide for the electrical insulation may, however, dampen the heat transfer from the top layer to the heat sink. Simultaneously, it has to be ensured that the arrangement of the heat dissipation device and the package body fulfills safety requirements regarding, e.g., a minimum clearance distance and a minimum creepage length.

SUMMARY

Certain aspects of the present specification are related to the surface-mount packaging technology. Exemplary embodiments of the package disclosed herein are surface-mount device (SMD) packages.

According to an embodiment, a package encloses a power semiconductor die and has a package body with a package top side, a package footprint side and package sidewalls, the package sidewalls extending from the package footprint side to the package top side, wherein the die has a first load terminal and a second load terminal and is configured to block a blocking voltage applied between said load terminals. The package comprises: a lead frame structure configured to electrically and mechanically couple the package to a support with the package footprint side facing to the support, the lead frame structure comprising at least one first outside terminal extending out of the package footprint side and/or out of one of the package sidewalls and electrically connected with the first load terminal of the die; a top layer arranged at the package top side and being electrically connected with the second load terminal of the die; and a heat spreader arranged external of the package body and in electrical contact with the top layer with a bottom surface of the heat spreader facing to the top layer, wherein the heat spreader further has a top surface, the area of the top surface being greater than the area of the bottom surface.

According to a further embodiment, a method comprises providing a package that encloses a power semiconductor die, the package having a package body with a package top side, a package footprint side and package sidewalls, the package sidewalls extending from the package footprint side to the package top side, wherein the die has a first load terminal and a second load terminal and is configured to block a blocking voltage applied between said load terminals, wherein the package comprises: a lead frame structure configured to electrically and mechanically couple the package to a support with the package footprint side facing to the support, the lead frame structure comprising at least one first outside terminal extending out of the package footprint side and/or out of one of the package sidewalls and electrically connected with the first load terminal of the die; and a top layer arranged at the package top side and being electrically connected with the second load terminal of the die. The method further comprises providing a heat spreader separately from the package body, the heat spreader having a bottom surface and a top surface, the area of the top surface being greater than the area of the bottom surface; mounting the heat spreader onto the top layer with the heat spreader bottom surface facing to the top layer.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures reference numerals may designate corresponding parts. In the drawings:

FIG. 4 schematically and exemplarily illustrates a section of a perspective view of a package body in accordance with one or more embodiments.

DETAILED DESCRIPTION

Figure 1:
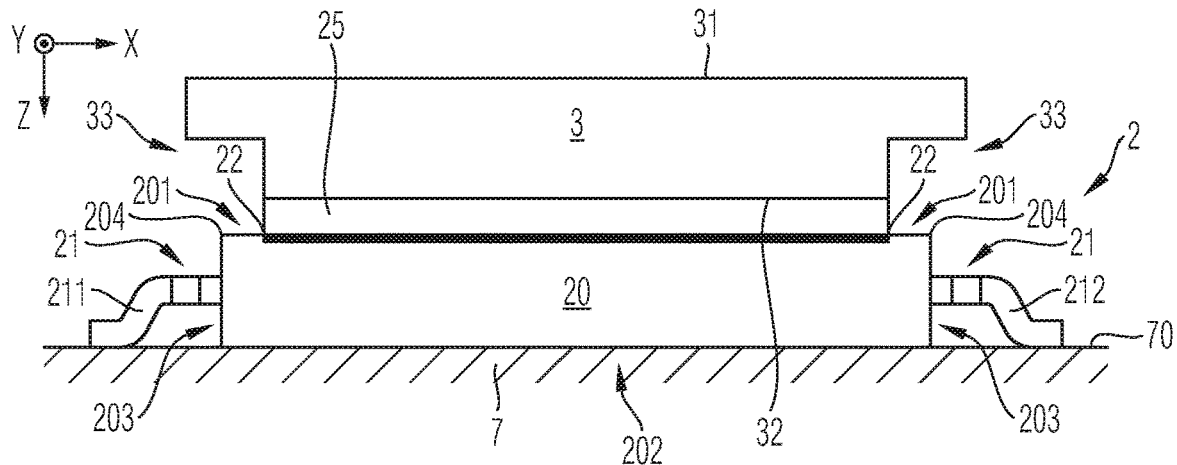
FIGS. 1-3 each schematically and exemplarily illustrate a section of a vertical cross-section of a package in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V.

For example, the power semiconductor die described below may be a die that is configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

Before being able to be employed within an application, the power semiconductor die is usually included within a package that may allow mechanically mounting and electrically connecting the die within the application, e.g., also for heat distribution purposes. As has been introductorily mentioned, this may include applying the surface-mount technology (SMT).

Exemplary embodiments of the package disclosed herein are surface-mount device (SMD) packages. For example, embodiments of the package disclosed herein are SMD packages with flat contacts that interface with a support, e.g., a PCB.

Figure 2:
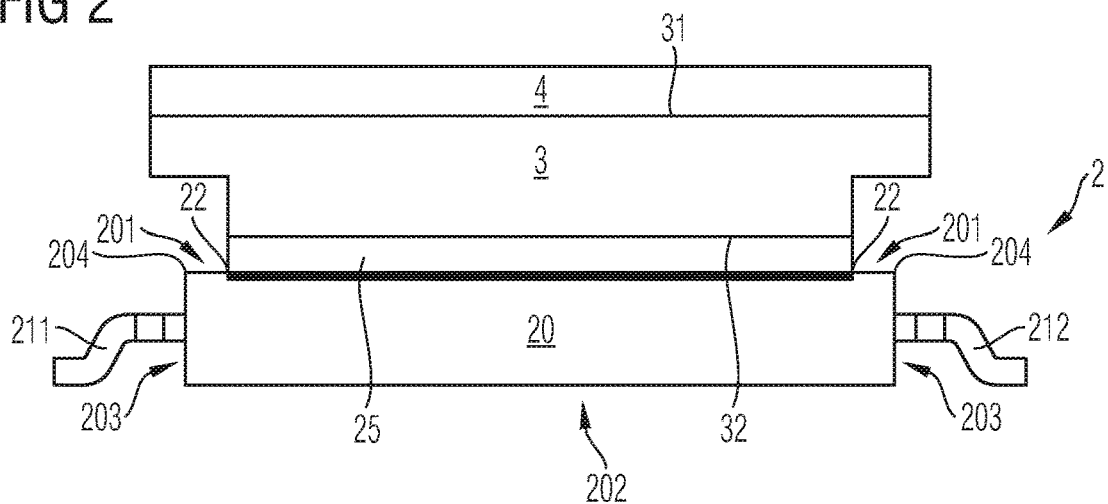
Figure 3:
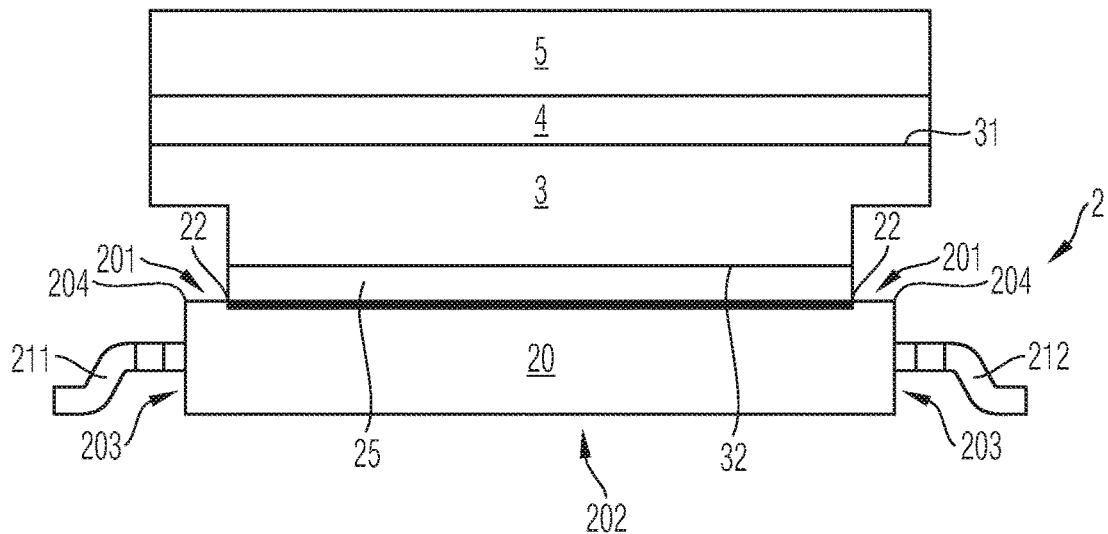

FIGS. 1-3 each schematically and exemplarily illustrate a section of a vertical cross-section of a package 2 in accordance with one or more embodiments, and FIG. 4 schematically and exemplarily illustrates a section of a perspective view of a package body 20 in accordance with one or more embodiments. In the following, it will be referred to each of FIGS. 1-4.

For example, the package body 20 as illustrated in FIG. 4 may be configured in a manner described in DE 10 2015 101 674 A1 and/or in DE 10 2015 120 396 A1.

The package 2 encloses a power semiconductor die (not illustrated), in the following also referred to as die. For example, the die has one of a power semiconductor transistor configuration or a power semiconductor diode configuration, e.g., a MOSFET configuration, an IGBT configuration, or a configuration derived from these basic configurations.

The power semiconductor die may hence comprise a first load terminal (not illustrated) and a second load terminal (not illustrated) and may be configured to conduct a load current between these load terminals. The load current maybe within the range of 1 A to 700 A, for example within the range of 10 A to 50 A. The maximum load current that can continuously be conducted by the die can be indicated by a load current rating of the die. Further, the enclosed die may be configured to block a blocking voltage applied between the first load terminal and the second load, e.g., within the range of 10 V to 1000 V, e.g., within the range of 50 V to 600 V. The maximum voltage that can continuously be blocked by the die can be indicated by a blocking voltage rating of the die.

In an embodiment, the die can be one of power diode, in which case the first load terminal can be anode port and the second load terminal can be cathode port, a power IGBT, in which case the first load terminal can be an emitter terminal and the second load terminal can be collector terminal, a MOSFET, in which case the first load terminal can be a source terminal and the second load terminal can be drain terminal, or a power device derived from one or more of these basic configurations, e.g., a JFET (Junction Field Effect Transistor), sometimes referred to as SFET (German: Sperrschicht Feld Effekt Transistor).

For example, the die includes or, respectively, is a monolithic bidirectionally blocking and conducting power semiconductor switch, e.g., the die can be one of a Si-, SiC- MOSFET or a GaN-HEMT (high-electron-mobility transistor).

Further, the die that is enclosed by the package 2 can have a vertical configuration, according to which the first load terminal is arranged at a die frontside and the second load terminal is arranged at a die backside. In lateral directions, e.g., in the lateral directions X and Y and linear combinations thereof, the die may be terminated by a die edge, e.g., a side surface.

The package 2 that encloses the die has a package body 20 with a package top side 201, a package footprint side 202 and package sidewalls 203, the package sidewalls 203 extending from the package footprint side 202 to the package top side 201 and forming an edge 204 therewith. The package body 20 can be made of a molding mass.

For example, the package body 20 exhibits a flat configuration, according to which: each of the package top side 201 the package footprint side 202 extend substantially horizontally; the package sidewalls 203 extend substantially vertically; and a maximum horizontal extension of the package footprint side 202 amounts to at least twice of a maximum vertical extension of the package sidewalls 203.

For example, the die is sandwiched in between the package top side 201 and the package footprint side 202. The package body 20 may entirely surround the die and seal the die against the environment.

The package 2 enclosing the die may be mounted on a support 7, e.g., in accordance with the surface-mount technology. For example, the package 2 may be a surface-mount device (SMD) package. Further, when being mounted on the support 7, the die included in the package 2 may be electrically connected with other components (not illustrated) that are provided (e.g. fixed) at the support 7.

The support 7 may be a printed circuit-board (PCB) or may be a component of a PCB. In another embodiment, the support 7 may be a Direct Copper Bond (DCB) substrate, e.g. a ceramic circuit board, or may be a component of a DCB substrate. In yet another embodiment, the support 7 may also be based on an Insulated Metallic Substrate (IMS). The support 7 may be made of an electrically insulating material, e.g., made of a polymer, a PCB laminate, a ceramic, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

The die may be arranged in the package 2 in such a manner that the die frontside faces to the package footprint side 202 and that the die backside faces to the package top side 201, or vice versa. Further, the package footprint side 202 may face to a surface 70 of the support 7. For example, the surface 70 is arranged horizontally, e.g., in parallel to the plane defined by the first lateral direction X and the second lateral direction Y.

For example, the package 2 may comprise a lead frame structure 21 configured to electrically and mechanically couple the package 2 to the support 7. The lead frame structure 21 may for example be configured to couple the package 2 to the support 7 with the package footprint side 202 facing to the support 7, for example such that the package footprint side 202 faces to the surface 70 of the support 7, as illustrated in FIG. 1.

The lead frame structure 21 may serve as an electrically conductive interface between the load terminals of the die (and, if present, the one or more further terminals of the die) and other components (not illustrated) that are fixed at the support 7. For example, the support 7 may comprise or be provided with other components (not illustrated; for example, one or more other packages including one or more other dies, and/or a controller, a sensor, a passive component, a load or the like) to which the terminals of the die are to be coupled via the lead frame structure 21. A connection between the lead frame structure 21 and the terminals of the die, e.g., the load terminals, may be realized by package internal connection means (not illustrated). For connecting the die with other components fixed to the support 7, the lead frame structure 21 may comprise one or more outside terminals, as will now be explained in more detail:

For example, the outside terminals of the lead frame structure 21 comprise at least one first outside terminal 211 extending out of the package footprint side 202 and/or out of one of the sidewalls 203 and electrically connected with the first load terminal of the die. Of course, there can be more than one of such first outside terminal 211 that are each connected to the first load terminal of the die. Further, the outside terminals of the lead frame structure 21 may comprise at least one second outside terminal 212 extending out of the package footprint side 202 and/or out of one of the sidewalls 203 (for example out of a sidewall 203 arranged opposite to the sidewall 203 out of which the first outside terminal(s) 211 may extend, cf. FIGS. 1-3) and electrically connected with the second load terminal of the die. Of course, there can be more than one of such second outside terminal 212 that are each connected to the second load terminal of the die. Further, the outside terminals of the lead frame structure 21 may comprise at least one third outside terminal (not illustrated) and/or at least one fourth outside terminal (not illustrated) extending out of the package footprint side 202 and/or out of one of the sidewalls 203 and electrically connected with a control terminal of the die (e.g., a gate terminal) and a sensor terminal (e.g., a current sensor terminal) of the die. Of course, there can be more than one of such third/fourth outside terminal.

Each of the outside terminals 211, 212 of the lead frame 21 may be configured to be electrically and mechanically coupled to the support 7, e.g., by soldering.

Within the present specification, the term "outside" may express that the first outside terminal 211 and the second outside terminal 212 may be configured to be electrically contacted by means of components external of the package body 20.

In an embodiment, the outside terminals 211, 212 are planar outside terminals. For example, within the present specification, the term "planar" may express that the first terminal 211 and the second terminal 212 may exhibit a respective substantially plane bottom surface that has a size with horizontal dimensions (e.g. along each of the first lateral direction X and the second lateral direction Y) at least as great as a vertical dimension of the respective terminal 211, 212 (e.g. along the vertical direction Z), as exemplarily illustrated in FIG. 1. For example, the lead frame 21 has a surface-mount configuration. To this end, the outside terminals 211 and 212 may be configured to allow mounting the package 2 in accordance with the surface-mount technology. Further, each of the first outside terminal 211 and the second outside terminal 212 may be so-called flat contacts (also known as "terminal pads") formed in accordance with the surface-mount technology. Thus, the package 2 may be a leadless package, e.g., an SMD leadless package. In another embodiment, the outside terminals 211 and 212 are configured as contact pins or as contact balls.

The outside terminals 211 and 212 may be arranged separately and electrically insulated from each other.

For example, on the support 7, a first contact area of the first outside terminal 211 may be electrically connected with one or more first conductive traces (not illustrated), e.g., copper lines, of the support 7, and a second contact area of the second outside terminal 212 may be electrically connected with one or more second conductive traces (not illustrated), e.g., copper lines, of the support 7.

Accordingly, the load current conducted by the power semiconductor die between the first load terminal and the second load terminal can "leave" or, respectively "enter" the package 2 by means of the first outside terminal(s) 211 and "enter" or, respectively "leave" the package 2 by means of the second outside terminal(s) 212.

The package 2 may further comprise top layer 22 arranged at the package top side 201 and being electrically connected with the second load terminal of the die, e.g., also with the second outside terminal(s) 212. The top layer 22 may be made of an electrically conductive material. The top layer 22 may hence exhibit the same electrical potential as the second load terminal of the die, e.g., the high potential (e.g., the drain potential). Further, the top layer 22 may be electrically insulated from the first outside terminal(s) 211.

For example, the top layer 22 is arranged substantially coplanar with the package top side 201; e.g., the top layer 22 does not protrude from the package top side 201.

The top layer 22 can have a horizontal surface area amounting to at least 50%, to at least 60% or to even more than 80% (but to less than 100%) of the total surface area of the package top side 201. This surface area may be exposed to the environment of the package body 20, i.e., the surface area of the top layer 22 is not enclosed within the package body 20, but forms a part of an exterior wall.

The package 2 is, for example, a top side cooling package with the top layer 22 being configured as a top side cooling. For example, at least most of the heat to be dissipated leaves the package body 20 via the top layer 22.

Now referring in more detail to FIGS. 1-3, the package 2 may further comprise a heat spreader 3 arranged external of the package body 20 and in electrical contact with the top layer 22 with a bottom surface 32 of the heat spreader 3 facing to the top layer 22. The heat spreader further has top surface 31, wherein the area of the top surface 31 is greater than the area of the bottom surface 31.

The top layer 22 can hence be configured to be coupled to the heat spreader 3. For example, the top layer 22 can be configured to be electrically connected to the heat spreader 3. Thus, the heat spreader, which may be made of, e.g., copper or another electrically conductive material, may exhibit the same electrical potential as the top layer 22, i.e., the second load terminal of the enclosed die.

When mounted, the bottom surface 32 of the heat spreader 3 can be arranged substantially coplanar with the top layer 22. Further, the bottom surface 32 of the heat spreader 3 may exhibit a bottom surface area as great as or smaller than the horizontal surface area of the top layer 22. The top surface 31 of the heat spreader 3 may exhibit a top surface area about as large as the footprint area of the package 2, which can be significantly larger than the surface area of top layer 22.

In a simple form, the heat spreader 3 may be a copper (or aluminum or steel or the like) body that is arranged in electrical contact with and that is mechanically coupled to the top layer 22; e.g., the body may be soldered to the top layer 22, as will be explained in more detail below.

In an embodiment, the area of the heat spreader top surface 31 amounts to at least 120%, to at least 135% or to even more than 150% of the area of the heat spreader bottom surface 32. Further, the area of the heat spreader bottom surface 32 can be within the range of 80% to 100% of the surface area of the top layer 22. For example, the area of the heat spreader bottom surface 32 is almost as large as the surface area of the top layer 22. To this end, a contour of the heat spreader bottom surface 32 may match a contour of the top layer 22, e.g., as illustrated in FIG. 4. But, the heat spreader bottom surface contour must not necessarily follow the contour sections as defined by local protrusion 221 of the top layer 22. Rather, the heat spreader bottom surface 32 may have a contour of a rectangle.

The area of the heat spreader top surface 31 can be within the range of 80% to 120% of the footprint area of the package 2. For example, the area of the heat spreader top surface 31 amounts to approximately 100% of the footprint area. Further, the heat spreader top surface 31 may have a contour that is adapted to the contour of the package footprint area.

For example, the heat spreader 3 comprises sidewalls 33 extending from the bottom surface 32 to the top surface 31, wherein at least one of the sidewalls 33 exhibits a profile with one or more non-vertical sections. The non-vertical sections may be designed such that said difference in surface area between the bottom surface 32 and the top surface 31 is achieved. Accordingly, many possibilities exist to provide for such profile of the sidewalls 33.

Further, the package body 20 and the heat spreader 3 may be arranged in a sandwich like manner, according which each of the package footprint side 202, the package top side 201, the top layer 22, the heat spreader bottom surface 32 and the heat spreader top surface 31 is arranged substantially horizontally.

The heat spreader 3 can be monolithic. It can be made of an electrically conductive material, e.g., copper or aluminium or steel. The heat spreader 3 is mounted to the top layer 22, e.g., by soldering, sintering and/or gluing. For example, a thin electrically conductive interconnect layer 25 may be provided in order to implement the electrical and mechanical connection between the top layer 22 and the heat spreader 3.

For example, the heat spreader 3 is positively locked to the top layer 22, e.g., connected thereto in a form-closed manner.

In accordance with an embodiment (cf., for example, FIGS. 2-3), the heat spreader top surface 31 is configured to be coupled to an isolation layer 4 that, on its other side, is configured to be coupled to a heat sink 5. For example, the isolation layer 4 may be a so-called K10 foil. For example, the isolation layer 4 exhibits a thickness of about 0.1 mm and a thermal conductivity of about 2 W/mK. The isolation layer 4 may be configured to electrically insulate from each other the heat sink 5 and the heat spreader 3 (which is electrically connected to the top layer 22).

For example, the isolation layer 4 exhibits an area that amounts to at least 120% of the area of the top layer 22. The area of the isolation layer 4 can be as large as the area of the heat spreader top surface 31 and hence greater than the area of the heat spreader bottom surface 32.

Thus, embodiments described above include the recognition that by providing a heat spreader 3 with an increased top surface area 31, the area of the isolation layer 4 can correspondingly be increased. Thereby, the heat transfer from the heat spreader 3 to the heat sink 5 can be significantly improved. In addition, since the sidewalls 33 of the heat spreader may be profiled and/or since the heat spreader bottom surface 32 is dimensioned as large as or smaller than the top layer 22, it can be ensured that the sections of the heat spreader that cause the surface increase are spatially displaced (e.g., along the vertical direction Z) from the package top surface 201, such that safety requirements regarding, e.g., a creepage length can be more easily fulfilled.

Despite the explanations above that were exemplarily directed to a single package 20 and a single heat spreader 3, it shall be understood that the heat spreader 3 can also be designed to cover the top layers of more than only one package body. However, also in accordance with such embodiments, the top surface of the heat spreader shall still be larger than the bottom surface of the heat spreader that covers the multiple top layers (and accordingly also equalizes the electrical potentials of the multiple top layers).

In accordance with another embodiment, a method is presented. The method comprises: providing a package that encloses a power semiconductor die, the package having a package body with a package top side, a package footprint side and package sidewalls, the package sidewalls extending from the package footprint side to the package top side, wherein the die has a first load terminal and a second load terminal and is configured to block a blocking voltage applied between said load terminals, wherein the package comprises: a lead frame structure configured to electrically and mechanically couple the package to a support with the package footprint side facing to the support, the lead frame structure comprising at least one first outside terminal extending out of the package footprint side and/or out of one of the package sidewalls and electrically connected with the first load terminal of the die; and a top layer arranged at the package top side and being electrically connected with the second load terminal of the die. The method further comprises providing a heat spreader separately from the package body, the heat spreader having a bottom surface and a top surface, the area of the top surface being greater than the area of the bottom surface; mounting the heat spreader onto the top layer with the heat spreader bottom surface facing to the top layer.

Regarding exemplary configurations of the heat spreader and of the package body, it is referred to the above. Accordingly, a heat spreader that is subjected to the processing method may be designed as the heat spreader 3 of the above described embodiments, and the package body (as well as the power semiconductor die it encloses) that is subjected to the processing method may be designed as the package body 20 of the above-described embodiments. The same applies to the support, which may hence be configured as the support 7 illustrated above.

Mounting the heat spreader 3 onto the top layer 22 may comprise at least one of soldering the heat spreader 3 to the top layer 22, applying a sintering processing step (e.g., an Ag-sintering processing step) and/or applying a gluing processing step (e.g., an Ag-gluing processing step).

As has been explained above, the contour of the heat spreader bottom surface 32 may match or, respectively, be adapted to the contour of the top layer 22. Thus, for example, when soldering the heat spreader 3 to the top layer 22, due to the local protrusions 221, it can be easily visually controlled by a person and/or a control device, whether or not the soldering process was successful. This is because during soldering, a small part of the soldering material may become pushed out towards the outside contour of the top layer 22 and hence become visible at the heat spreader sidewalls 33 above the local protrusions 221.

Further, as has been explained above, the package body 20 can be made of a molding mass, wherein the molding mass may spatially confine the top layer 22 at the package top side 201 (e.g., as illustrated in FIG. 4). Hence, since the contour of the heat spreader bottom surface 32 may match or, respectively, be adapted to the contour of the top layer 22, mounting the heat spreader 3 onto the top layer 22 can occur in accordance with a self-adjusted process; the heat spreader 3 is, e.g., automatically oriented correctly when being soldered to the top layer 22.

The method may further comprise providing the support 7 and, before mounting the heat spreader 3 to the top layer 22, soldering the at least one outside terminal 211 to the support 7. For example, soldering the at least one outside terminal 211 to the support 7 comprises at least one first reflow soldering processing step.

Thereafter, the heat spreader 3 may be mounted onto the top layer 22. For example, mounting the heat spreader 3 onto the top layer 22 comprises at least one second reflow soldering processing step. In another embodiment, mounting the heat spreader 3 onto the top layer 22 comprises at least one diffusion soldering processing step. In another embodiment, mounting the heat spreader 3 onto the top layer 22 comprises at least one Ag-sintering processing step. In yet another embodiment, mounting the heat spreader 3 onto the top layer 22 comprises at least one Ag-gluing processing step.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A package enclosing a power semiconductor die, the package having a package body with a package top side, a package footprint side and package sidewalls, the package sidewalls extending from the package footprint side to the package top side, wherein the die has a first load terminal and a second load terminal and is configured to block a blocking voltage applied between said load terminals, wherein the package comprises:
a lead frame structure configured to electrically and mechanically couple the package to a support with the package footprint side facing to the support, the lead frame structure comprising at least one first outside terminal extending out of one of the package sidewalls and electrically connected with the first load terminal of the die;
a top layer arranged at the package top side and being electrically connected with the second load terminal of the die; and
a heat spreader arranged external of the package body and in electrical contact with the top layer, with a bottom surface of the heat spreader facing to the top layer,
wherein the heat spreader further has a top surface, an area of the top surface being greater than an area of the bottom surface,
wherein the package body is made of a molding mass, wherein the molding mass spatially confines the top layer at the package top side.

2. The package of claim 1, wherein the area of the heat spreader top surface is at least 120% of the area of the heat spreader bottom surface.

3. The package of claim 1, wherein a bottom surface of the top layer has a surface area at least 50% and less than 100% of a total surface area of the package top side.

4. The package of claim 1, wherein the area of the heat spreader bottom surface is within a range of 80% to 100% of a surface area of a top surface of the top layer.

5. The package of claim 1, wherein a contour of the heat spreader bottom surface matches a contour of the top layer.

6. The package of claim 1, wherein the area of the heat spreader top surface is within a range of 80% to 120% of a footprint area of the package.

7. The package of claim 1, wherein the heat spreader comprises sidewalls extending from the bottom surface to the top surface, and wherein at least one of the sidewalls exhibits a profile with one or more non-vertical sections.

8. The package of claim 1, wherein each of the package footprint side, the package top side, the top layer, the heat spreader bottom surface and the heat spreader top surface is arranged substantially horizontal.

9. The package of claim 1, wherein the top layer is arranged substantially coplanar with the package top side.

10. The package of claim 1, wherein the heat spreader is monolithic.

11. The package of claim 1, wherein the heat spreader is made of an electrically conductive material.

12. The package of claim 1, wherein the heat spreader is soldered to the top layer.

13. The package of claim 1, wherein the heat spreader is positively locked to the top layer.

14. The package of claim 1, further comprising an electrically conductive interconnect layer arranged between and in contact with each of the heat spreader and the top layer.

15. The package of claim 1, wherein the heat spreader top surface is configured to be coupled to an isolation layer that, and wherein the isolation layer has an area at least 120% of the area of the top layer.

16. The package of claim 1, wherein the package is a top side cooling package with the top layer being configured for top side cooling.

17. The package of claim 1, wherein:
each of the package top side and the package footprint side extend substantially horizontally;
the package sidewalls extend substantially vertically; and
a maximum horizontal extension of the package footprint side is at least twice of a maximum vertical extension of the package sidewalls.

18. The package of claim 1, wherein a blocking voltage of the power semiconductor die is at least 50 V and/or wherein the power semiconductor die includes a monolithic bidirectionally blocking and conducting power semiconductor switch.

19. The package of claim 1, wherein the package is a surface-mount device (SMD) package.

* * * * *